United States Patent [19]
Asai et al.

[11] Patent Number: 5,418,093
[45] Date of Patent: May 23, 1995

[54] PROJECTION EXPOSURE METHOD AND AN OPTICAL MASK FOR USE IN PROJECTION EXPOSURE

[75] Inventors: Satoru Asai; Isamu Hanyu; Mitsuji Nunokawa, all of Kawasaki, Japan

[73] Assignee: Fujitsu Limited, Kawasaki, Japan

[21] Appl. No.: 201,079

[22] Filed: Feb. 24, 1994

Related U.S. Application Data

[63] Continuation of Ser. No. 836,591, Feb. 18, 1992, abandoned.

[30] Foreign Application Priority Data

Feb. 19, 1991 [JP] Japan .................................. 3-045394

[51] Int. Cl.[6] .............................................. G03F 9/00
[52] U.S. Cl. ........................................ 430/5; 430/311; 430/396
[58] Field of Search .................... 430/5, 269, 311, 396

[56] References Cited

U.S. PATENT DOCUMENTS 5,130,213  7/1992  Berger et al. ............................ 430/5

FOREIGN PATENT DOCUMENTS 0293643  12/1988  European Pat. Off. .
2104273   4/1972  France .
1154327   9/1963  Germany .
2835363   3/1980  Germany .

OTHER PUBLICATIONS

Fehrs et al, "Illuminator Modification of an Optical Aligner", Proceeding the KTI Microfabrication Seminar Interface, pp. 217-230, 1989.

T. Ito et al., "Photo-Projection Image Distortion Correction for a 1-μm Pattern Process," *Electronics and Communications in Japan*, Part 2, vol. 69, No. 3, 1986, New York, N.Y., pp. 30-38.

*Patent Abstracts of Japan*, vol. 15, No. 268 (P-1224) 8 Jul. 1991 & JP-A-3 089347 (Fujitsu Ltd) 15 Apr. 1991.

*Primary Examiner*—Steve Rosasco
*Attorney, Agent, or Firm*—Staas & Halsey

[57] ABSTRACT

A projection exposure method includes the steps of (a) irradiating a light from a light source on an optical mask, where the optical mask includes a main space which transmits light and has a desired exposure pattern, and a subspace which transmits light and is provided adjacent to the main space, and (b) exposing a photoresist layer by the light which is transmitted through the optical mask via a lens so as to project an optical image of the main space, where the subspace has a narrow width such that the light transmitted through the subspace by itself does not expose the photosensitive layer.

15 Claims, 8 Drawing Sheets

CENTER

PROJECTION EXPOSURE METHOD AND AN OPTICAL MASK FOR USE IN PROJECTION EXPOSURE

This application is a continuation, of application Ser. No. 07/836,591, filed Feb. 18, 1992, now abandoned.

BACKGROUND OF THE INVENTION

The present invention generally relates to projection exposure methods and optical masks, and more particularly to a projection exposure method necessary for the fine photolithography technique which is used in the process of producing semiconductor integrated circuit devices, and an optical mask which is used in such a projection exposure.

Because the operation speed and integration density of semiconductor integrated circuit devices have increased in recent years, there are demands to establish photolithography techniques which can form even finer patterns.

Various phase shift methods have been proposed as photolithography techniques capable of forming fine patterns. The phase shift method uses the phase difference of lights which are transmitted through parts of an optical mask having mutually different thicknesses. However, it is still impossible to completely satisfy the above described demands using the phase shift method.

According to the conventional phase shift method, it is essential to use a phase shift mask which is formed with a high accuracy. However, there are problems in that it is extremely difficult to produce, inspect and correct the phase shift mask which is formed with the high accuracy.

SUMMARY OF THE INVENTION

Accordingly, it is a general object of the present invention to provide a novel and useful projection exposure method and optical mask therefor, in which the problems described above are eliminated.

Another and more specific object of the present invention is to provide a projection exposure method comprising the steps of (a) irradiating a light from a light source on an optical mask, where the optical mask includes a main space which transmits light and has a desired exposure pattern, and a subspace which transmits light and is provided adjacent to the main space, and (b) exposing a photoresist layer by the light which is transmitted through the optical mask via a lens so as to project an optical image of the main space, where the subspace has a narrow width such that the light transmitted through the subspace by itself does not expose the photosensitive layer. According to the projection exposure method of the present invention, it is possible to increase the intensity of the light transmitted through the main space which is to be exposed, without the use of a phase shifter which is difficult to produce, inspect and correct. As a result, it is possible to project a fine and sharp optical image of the main space on the photoresist layer. When a ring shaped light source or the like is used as the light source, the depth of focus becomes large, and it becomes possible to project a sharp optical image even on a wafer which does not have a perfectly flat surface.

Still another object of the present invention is to provide a projection optical mask for use in an exposure system in which a light from a light source irradiates the projection optical mask and an optical image transmitted through the projection optical mask is projected on a photoresist layer via a lens, which projection optical mask comprises a main space which transmits light and has a desired exposure pattern, and at least one subspace which transmits light and is provided adjacent to the main space, where the subspace having a narrow width such that the light transmitted through the subspace by itself does not expose the photosensitive layer. According to the projection optical mask of the present invention, it is possible to increase the intensity of the light transmitted through the main space which is to be exposed, and the projection optical mask can be produced with ease compared to a phase shifter which is difficult to produce, inspect and correct. As a result, it is possible to project a fine and sharp optical image of the main space on the photoresist layer.

Other objects and further features of the present invention will be apparent from the following detailed description when read in conjunction with the accompanying drawings.

DESCRIPTION OF THE PREFERRED EMBODIMENTS

First, a description will be given of an operating principle of a projection exposure method according to the present invention, by referring to FIGS. 1 and 2.

Figure 1:
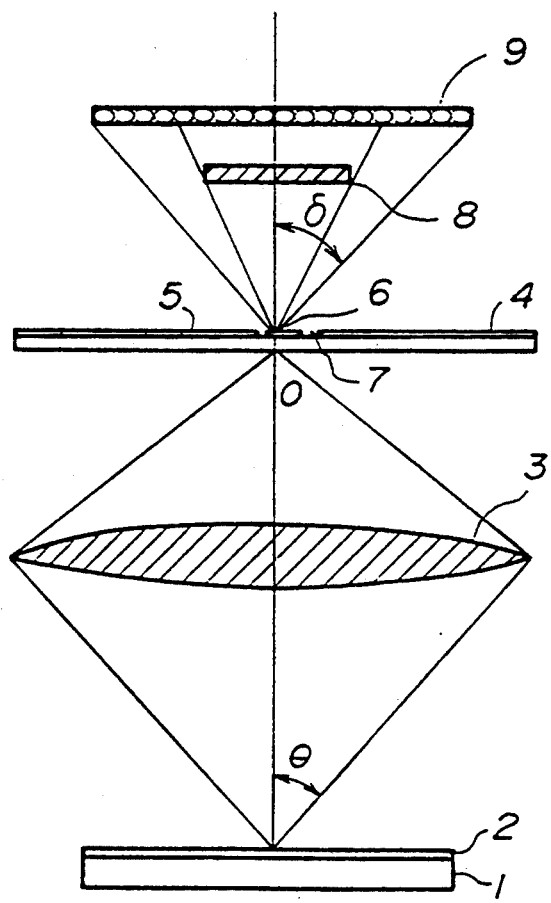
FIG. 1 is a cross sectional view for generally explaining the operating principle of a projection exposure method according to the present invention.

FIG. 1 generally shows an exposure system employed by the projection exposure method. An optical mask 4 is positioned between a light source 9 and a lens 3. The optical mask 4 includes a main space 6 and a subspace 7 which are formed in a light blocking layer 5. The light from the light source irradiates the optical mask 4 via a light blocking member 8, and the light transmitted through the main space 6 and subspace 7 irradiate a photoresist layer 2 on a semiconductor wafer 1 via the lens 3.

The light source 9 used is such that the light emitted from a mercury discharge lamp (not shown) is converged by a plurality of fly-eye lenses which are arranged in a plane. However, the light blocking member 8 is provided at a central part of the light source 9, and as a result, the optical mask 4 is irradiated by the light source 9 which has a ring or annular shape about a projection optical axis. For the sake of convenience, FIG. 1 shows the annular light source 9. But as will be described later, the light source 9 is not limited to the annular shape and may have other shapes such as the light source which is provided only on two sides of the projection optical axis.

On the other hand, the optical mask 4 according to the present invention has two kinds of spaces, namely, the main space 6 and the subspace 7. No light blocking layer 5 is provided at the line shaped main space 6. Similarly, no light blocking layer 5 is provided at the subspace 7, but the width of this subspace 7 is narrow so that the pattern of the subspace 7 will not be exposed on the photoresist layer 2.

The light from the light source 9 transmitted through the main space 6 and subspace 7 is converged by the lens 3 and projected on the photoresist layer 2 on the semiconductor wafer 1 with a reduced projection.

Figure 2:
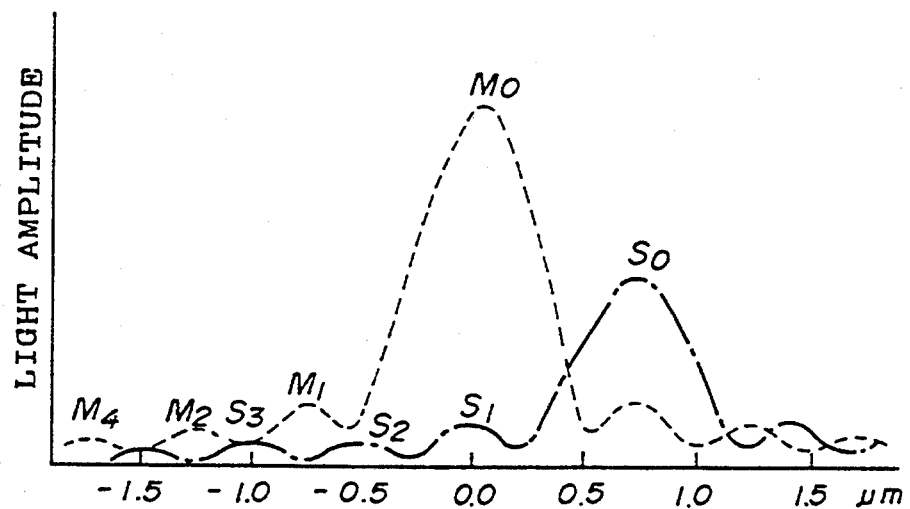
FIG. 2 shows the light amplitude at various parts on a photoresist layer.

FIG. 2 shows the amplitude of the light transmitted through the main space 6 and subspace 7 of the optical mask 4 when the light source 9 exists at a position which makes an angle of 2.6° relative to the projection optical axis.

For example, the distance between the center lines of the main space and subspace 7 converted into the distance on the photoresist layer 2 is $(\lambda/NA) \times 0.7$ (L=0.7), where $\lambda$ denotes the wavelength of the exposing light and NA ($\sin\theta$) denotes the numerical aperture of the lens 3. This distance is 0.7 $\mu$m if the light used is the g-line which is emitted from the mercury discharge lamp having the wavelength of 4358 Å, and the numerical aperture NA is 0.45. In addition, the width of the subspace 7 is 0.2 $\mu$m and narrow so that the pattern of the subspace 7 will not be exposed by itself on the photoresist layer 2.

In FIG. 2, the dotted line indicates the amplitude of the light transmitted through the main space 6 of the optical mask 4 shown in FIG. 1. On the other hand, a one-dot chain line indicates the amplitude of the light transmitted through the subspace 7. The light transmitted through the main space 6 includes in addition to a main transmitted light $M_0$ a first diffracted light $M_1$, a second diffracted light $M_2$, a third diffracted light $M_3$, a fourth diffracted light $M_4$, . . . . Similarly, the light transmitted through the subspace 7 includes in addition to a main transmitted light $S_0$ a first diffracted light $S_1$, a second diffracted light $S_2$, a third diffracted light $S_3$, a fourth diffracted light $S_4$, . . . . The peak of the first diffracted light $S_1$ of the subspace 7 is added to the peak of the main transmitted light $M_0$ of the main space 6. If the phases of the lights which are added are such that an addition of the light amplitudes takes place, the waveform of the synthesized light becomes sharp and it becomes possible to obtain an optical image which is fine and sharp.

As may be understood from FIG. 2, the sharpness of the waveform of the synthesized light is lost and a sharp optical image cannot be obtained if the main space 6 and subspace 7 are too close to each other or too far separated from each other such that the distance between the center lines of the main space 6 and subspace 7 is not $(\lambda/NA) \times L$. This is because the first diffracted light $S_1$ of the subspace 7 moves close to the sloping part of the main transmitted light $M_0$ of the main space 6 or, the phases of the lights which are added become such that a subtraction of the light amplitudes takes place.

Although FIG. 1 shows only one subspace 7 provided on one side of the main space 6, it is of course possible to provide one subspace 7 on each side of the main space 6. If the subspace 7 is provided on both sides of the main space 6, the first diffracted lights of both subspaces 7 are added to the main transmitted light of the main space 6, and the above described effect of sharpening the optical image becomes doubled.

Figure 3:
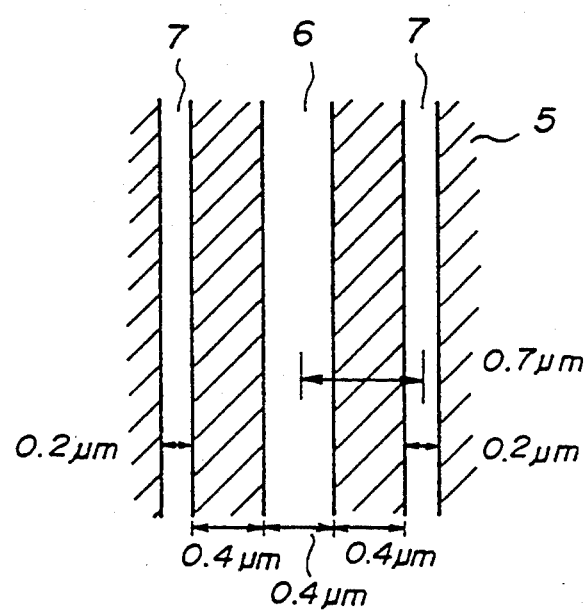
FIG. 3 is a plan view showing an essential part of a first embodiment of an optical mask according to the present invention.

Next, a description will be given of a first embodiment of the projection optical mask according to the present invention, by referring to FIG. 3. In FIG. 3, those parts which are the same as those corresponding parts in FIG. 1 are designated by the same reference numerals, and a description thereof will be omitted.

In the optical mask 4 shown in FIG. 3, the main space 6 has a width of 0.4 $\mu$m, and the subspaces 7 provided on both sides of the main space 6 have a width of 0.2 $\mu$m, when respectively converted into the dimensions on the semiconductor wafer 1. In addition, the distance between the center lines of the main and sub spaces 6 and 7 when converted into the dimensions on the semiconductor wafer 1 is 0.7 $\mu$m. If the reduction at the time of the projection is by 5, the actual dimensions on the optical mask 4 is such that the main space 6 has a width of 2.0 $\mu$m, the sub space 7 has a width of 1.0 $\mu$m, and the distance between the center lines of the main and sub spaces 6 and 7 is 3.5 $\mu$m. In other words, if the reduced projection magnification is denoted by 1/m, the distance between the center lines of the main and sub spaces 6 and 7 can be described by $(\lambda/NA) \times m \times 0.7$.

The optical mask 4 shown in FIG. 3 is used in an exposure system such as that shown in FIG. 1. In this embodiment, the mercury discharge lamp which emits the g-line having the wavelength of 4358 Å is used as the light source, and the g-line is converged by the fly-eye lenses which are arranged in a plane. A light blocking member is provided between the light source and the optical mask 4 so that the light source emits light from a ring-shaped region. The light emitted from this ring-shaped region makes an angle $\delta$ of 2.1° to 2.6° relative to the projection optical axis at the center of the optical mask 4. In addition, it is assumed that the numerical aperture NA of the lens 3 is 0.45.

Figure 4:
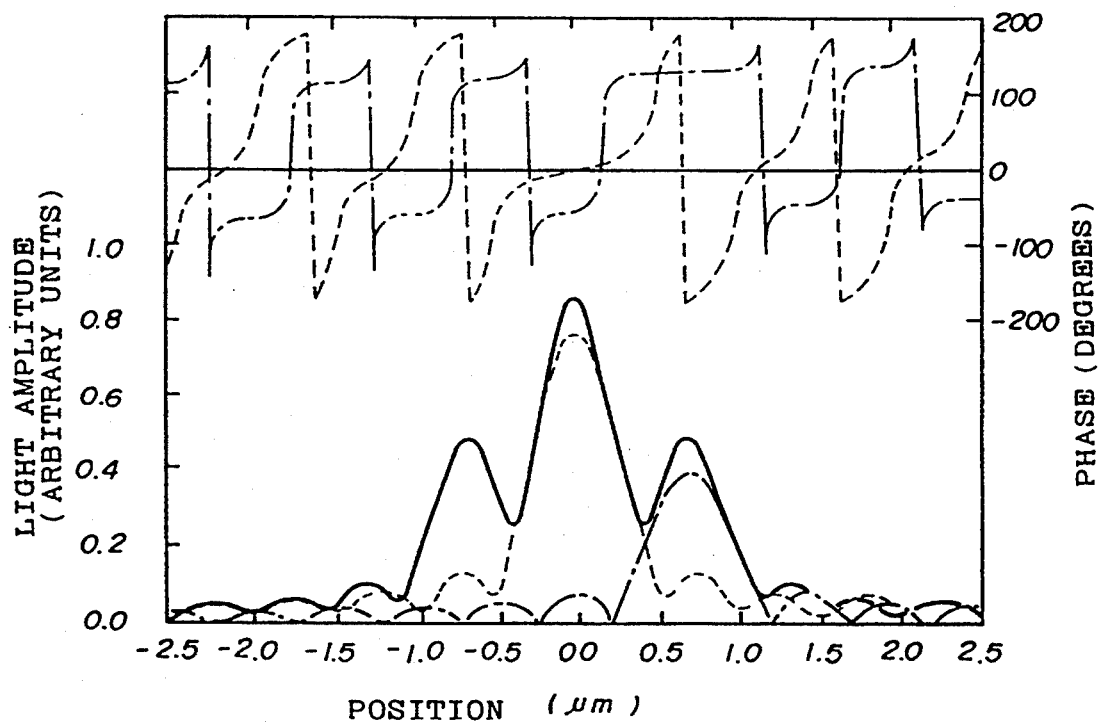
FIG. 4 shows the relationship of the amplitude and phase of the light transmitted through the first embodiment of the optical mask.

FIG. 4 shows the relationship of the amplitude and phase of the transmitted light in this embodiment. In FIG. 4, the abscissa denotes the distance from the center line of the main space 6 which has the desired pattern which is to be exposed, and the ordinate denotes the amplitude and the phase of the light transmitted through the optical mask 4. The light amplitude is shown in arbitrary units. For convenience, the amplitude-phase relationship of the transmitted light is only shown for the main space 6 and the subspace 7 which is provided on the right side of the main space 6 in FIG. 4, so as to avoid this figure from becoming too complex. Hence, the illustration of the amplitude-phase relationship of the light transmitted through the subspace 7 which is provided on the left side of the main space 6 is omitted in FIG. 4. In FIG. 4, the amplitude and phase of the light transmitted through the main space 6 are indicated by dotted lines, the amplitude and phase of the light transmitted through the right subspace 7 is indicated by one-dot chain lines, and the amplitude of the synthesized light which is made up of the lights transmitted through the main space 6 and the right subspace 7 is indicated by a solid line.

It may be seen from FIG. 4 that the light transmitted through the main space 6 has a large amplitude but its peak is not very sharp, and that the amplitude of the light transmitted through the subspace 7 is approximately ½ that of the light transmitted through the main space 6. In addition, when the amplitude of the synthesized light at the center line of the main space 6 is observed in FIG. 4, the phase relationship of the main transmitted light of the main space 6 and the first diffracted light of the subspace 7 is such that the amplitudes of these lights are added. Accordingly, the amplitude of the light is increased and sharpened, which means that it is possible to expose on the photoresist layer 2 an optical image which is sharp and has a fine width.

Due to the light transmitted through the subspace 7, the light amplitude has a peak caused by the main transmitted light of the subspace 7 at a position which is 0.7 $\mu$m from the center line of the main space 6, on each side of the main space 6. However, the energy of the light is the square of the amplitude shown in FIG. 4. For this reason, the photoresist layer 2 will not be affected by the peak caused by the main transmitted light of the subspace 7, and no problem will be introduced upon the exposure of the main space 6.

If the width of the subspace 7 is $(\lambda/NA)\times(0.2\sim0.3)$, where $\lambda$ denotes the wavelength of the exposing light which is 4358 Å for the g-line and the numerical aperture NA of the lens 3 is 0.45, the light transmitted through the subspace 7 by itself does not have an energy sufficient to expose the photoresist layer 2.

Figure 5A:
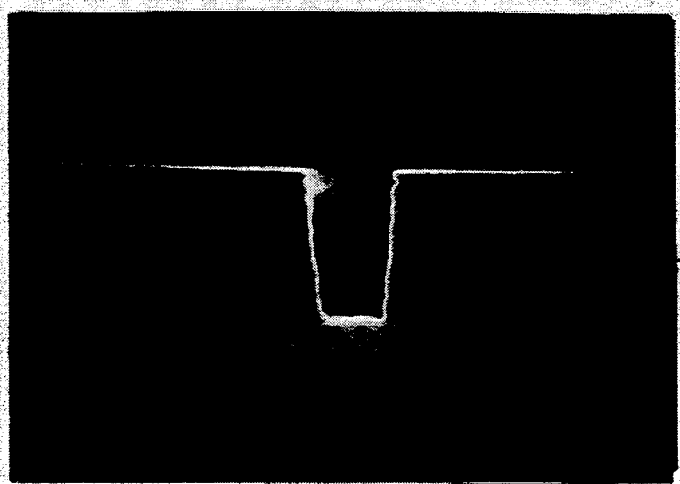
FIGS. 5A and 5B are photographs respectively showing the crystal structure including the photoresist layer for a case where no subspace is provided and a case where a subspace is provided.
Figure 5B:
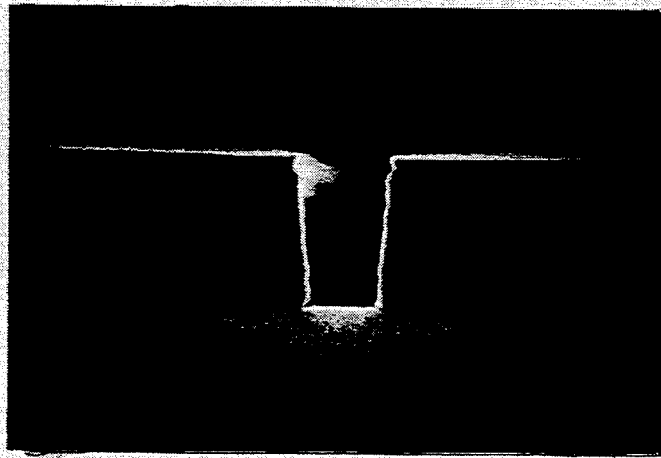

FIGS. 5A and 5B respectively show photographs of the crystal structures including the photoresist layer 2 for the case where no subspace 7 is provided and for the case where the subspace 7 is provided.

As may be seen from FIG. 5A, if the exposure is made using the optical mask 4 having only the main space 6 which has the width of 0.4 $\mu$m and the exposed pattern is developed, a part of the photoresist layer 2 remains at the bottom surface of the opening in the photoresist layer 2, and a complete patterning is not achieved. However, if the exposure is made using the optical mask 4 which has the main space 6 which has the width of 0.4 $\mu$m and the subspaces 7 which have the width of 0.2 $\mu$m and the exposed pattern is developed, no photoresist layer 2 remains at the bottom surface of the opening in the photoresist layer 2 and a patterning with a sharp contour is achieved as may be seen from FIG. 5B.

In this embodiment, the optical mask 4 used has the main space 6 which has the desired pattern which is to be exposed, and the subspace 7 which is provided adjacent to the main space 6 and has the small width such that the light transmitted through the subspace 7 by itself will not expose the photoresist layer 2. However, the subspace 7 may of course have a desired pattern which is to be exposed and be provided adjacent to the main space 6. In this case, both patterns of the main and subspaces 6 and 7 will be exposed, and the projection images transmitted through the respective spaces 6 and 7 will sharpen each other.

Although this embodiment was described using the light source which has the ring shape about the projection optical axis which is perpendicular to the optical mask, the shape of the light source is not limited to the ring shape. A light source which is arranged on only two sides of the optical projection axis may be used depending on the shape of the space 6 provided on the optical mask 4, and it is possible to obtain effect similar to those described above using such a light source.

Next, a description will be given of a first embodiment of a projection exposure method according to the present invention.

Figure 6A:
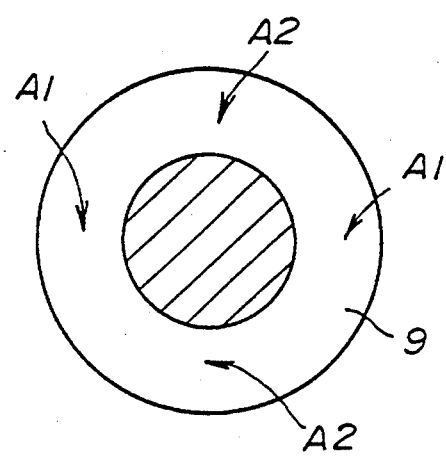
FIGS. 6A through 6D are plan views respectively showing various shapes of light sources used in first through fifth embodiments of a projection exposure method according to the present invention.

This embodiment of the projection exposure method uses the exposure system having the construction shown in FIG. 1. Accordingly, the light source 9 in the plan view is as shown in FIG. 6A which shows a ring shaped light source. If the main space 6 of the optical mask 4 extends in a direction perpendicular to the paper in FIG. 1, the light at a part A1 of the light source 9 in FIG. 6A contributes to the improvement of the resolution when exposing the main space 6 because the phase relationship of the first diffracted light $S_1$ from the subspace 7 and the main transmitted light $M_0$ from the main space 6 is such that the two are added. However, the light at a part A2 of the light source 9 in FIG. 6A deteriorates the resolution when exposing the main space 6 because the phase relationship of the first diffracted light $S_1$ from the subspace 7 and the main transmitted light $M_0$ from the main space 6 is such that the two are subtracted. On the other hand, if the main space 6 extends in a direction parallel to the paper in FIG. 1, the light at the part A2 contributes to the improvement of the resolution when exposing the main space 6, while the light at the part A1 deteriorates the resolution when exposing the main space 6.

Figure 6B:
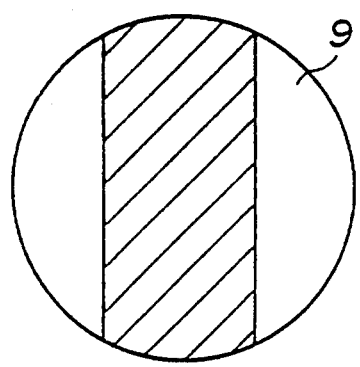
Figure 6C:
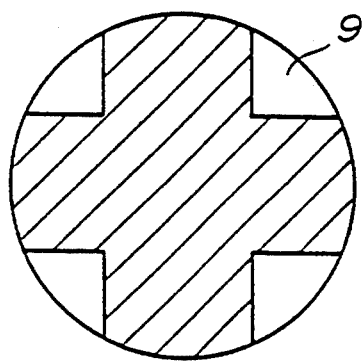
Figure 6D:
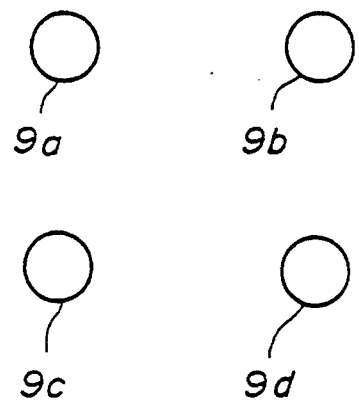
Figure 6E:
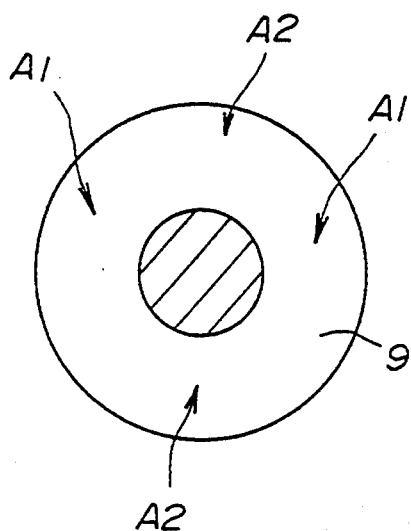
FIG. 6E and 6F are plan views showing the relationship of the light source and the optical mask.
Figure 6F:
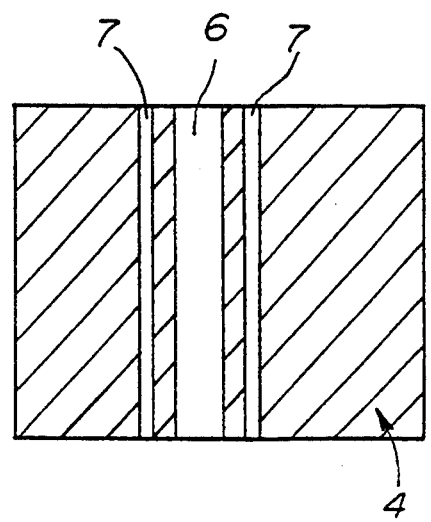

The relationship of the light source 9 and the optical mask 4 is shown in FIG. 6E. For the sake of convenience, FIG. 6E shows the light source 9 shown in FIG. 6A and the optical mask 4 side by side in the plan view.

Next, a description will be given of embodiments which use a light source 9 having a shape dependent on the pattern of the main space 6 which is to be exposed.

According to a second embodiment of the projection exposure method of the present invention, the exposure system having the construction shown in FIG. 1 is used for the projection exposure but the plan view of the light source 9 used is as shown in FIG. 6B. The light source 9 is arranged only on both sides of the projection optical axis. Hence, if the main space 6 of the optical mask 4 extends in the direction perpendicular to the paper in FIG. 1, the phase relationship of the first diffracted light $S_1$ from the subspace 7 and the main transmitted light $M_0$ from the main space 6 is such that the two are added, and the resolution is improved when exposing the main space 6.

Figure 7:
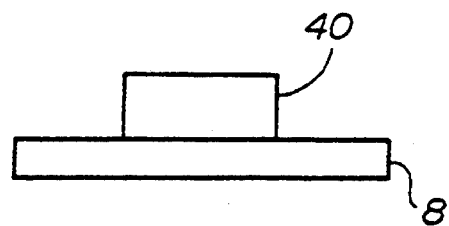
FIG. 7 is a cross sectional view showing a light blocking member which is used in the third embodiment of the projection exposure method according to the present invention.

According to a third embodiment of the projection exposure method of the present invention, the exposure system having the construction shown in FIG. 1 is used for the projection exposure but the plan view of the light source 9 used is as shown in FIG. 6B. In addition, the light blocking member 8 is supported on a support bracket 40 which is rotatable, as shown in FIG. 7. Thus, if the main space 6 extends in the direction parallel to the paper in FIG. 1, the support bracket 40 is rotated 90° so that the arrangement of the light source 9 becomes the same as that shown in FIG. 6B which is rotated 90°. The support bracket 40 may be rotated depending on the direction in which the main space 6 of the optical mask 4 extends, and the resolution can be improved particularly when the exposure process is made up of a plurality of exposing steps. In other words, the rotary position of the bracket 40 may be set depending on the pattern which is to be exposed so that the effect of improving the resolution becomes large.

According to a fourth embodiment of the projection exposure method of the present invention, the exposure system having the construction shown in FIG. 1 is used for the projection exposure but the plan view of the light source 9 used is as shown in FIG. 6C. As may be readily understood from the description given above, this embodiment can improve the resolution when exposing the main space 6, regardless of whether the main space 6 extends in the direction perpendicular to the paper in FIG. 1 or extends in the direction parallel to the paper in FIG. 1.

In each of the embodiments of the projection exposure method, the light sources 9 having the various shapes are obtained by use of the light blocking member 8. However, the light blocking member 8 may be omitted if the light source 9 itself can assume one of the various shapes.

According to a fifth embodiment of the projection exposure method of the present invention, the exposure system having the construction shown in FIG. 1 is used for the projection exposure but the plan view of the light source 9 used is as shown in FIG. 6D. The light source 9 shown in FIG. 6D is made up of four light source parts 9a through 9d. The effects obtainable in this embodiment are substantially the same as those obtainable in the fourth embodiment of the projection exposure method.

Figure 8:
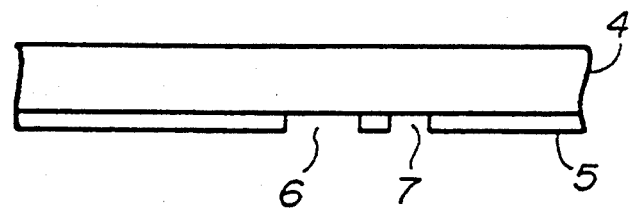
FIG. 8 is a cross sectional view showing an essential part of a second embodiment of the optical mask according to the present invention.

The light blocking layer 5 of the optical mask 4 shown in FIG. 1 is provided on the top surface of the optical mask 4. However, the light blocking layer 5 may be provided on the bottom surface of the optical mask 4 as shown in FIG. 8. FIG. 8 shows a second embodiment of the projection optical mask according to the present invention. In FIG. 8, those parts which are the same as those corresponding parts in FIG. 1 are designated by the same reference numerals, and a description thereof will be omitted.

Next, a description will be given of a sixth embodiment of the projection exposure method according to the present invention. This embodiment of the projection exposure method uses a third embodiment of the projection optical mask which has at least first and second subspaces provided with respect to one main space.

Figure 9:
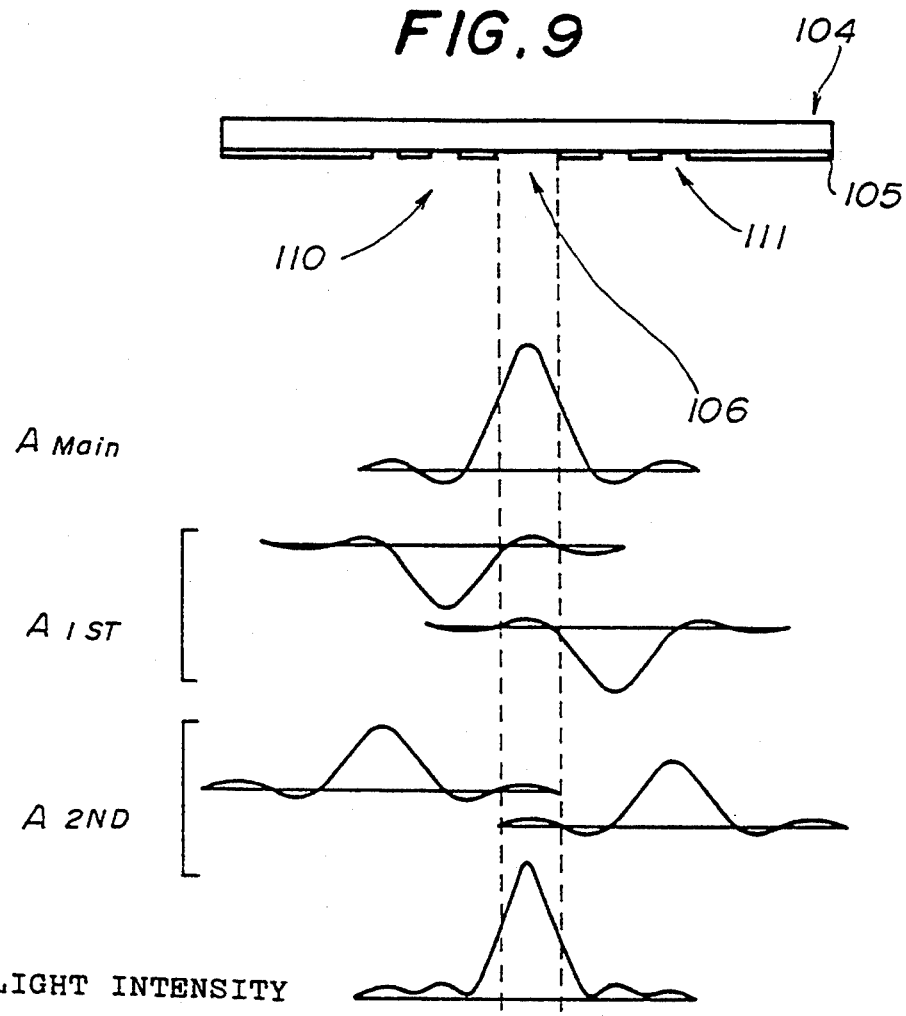
FIG. 9 is a diagram for explaining a sixth embodiment of the projection exposure method according to the present invention and a third embodiment of the optical mask according to the present invention.

As shown in FIG. 9, a light blocking layer 105 is provided on the bottom surface of an optical mask 104, and a first subspace 110 and a second subspace 111 are provided on both sides of a main space 106.

The intensity of the light $A_{Main}$ transmitted through the main space 106 increases at the central part of the main space 106 due to the interference with the diffracted light $A_{1st}$ corresponding to the first subspace 110 and also due to the interference with the diffracted light $A_{2nd}$ corresponding to the second subspace 111. In order to increase the transmitted light $A_{Main}$ at the central part of the main space 106, the peaks of the side-lobes of the diffracted lights $A_{1st}$ and $A_{2nd}$ which interfere with the transmitted light $A_{Main}$ should approximately match the central part of the main space 106, and the incident angle $\theta$ of the light from the light source incident to the optical mask 104 should be varied so as to optimize the phases of the mutually interfering diffracted lights $A_{1st}$ and $A_{2nd}$.

If the wavelength of the exposing light is denoted by $\lambda$, the numerical aperture of the lens 3 by NA, and the reduced projection magnification by 1/m, the peak position of the side-lobe corresponding to the first subspace 110 is located at a distance $d_1 = (0.7 \sim 0.8) \times m \times (\lambda/NA)$ from the center position of the main space 106. In addition, the peak position of the side-lobe corresponding to the second subspace 111 is located at a distance $d_2 = (1.2 \sim 1.3) \times m \times (\lambda/NA)$ from the center position of the main space 106. Accordingly, the center position of the first subspace 110 should be provided at the distance $d_1$ from the center position of the main space 106, and the center position of the second subspace 111 should be provided at the distance $d_2$ from the center position of the main space 106.

Figure 10:
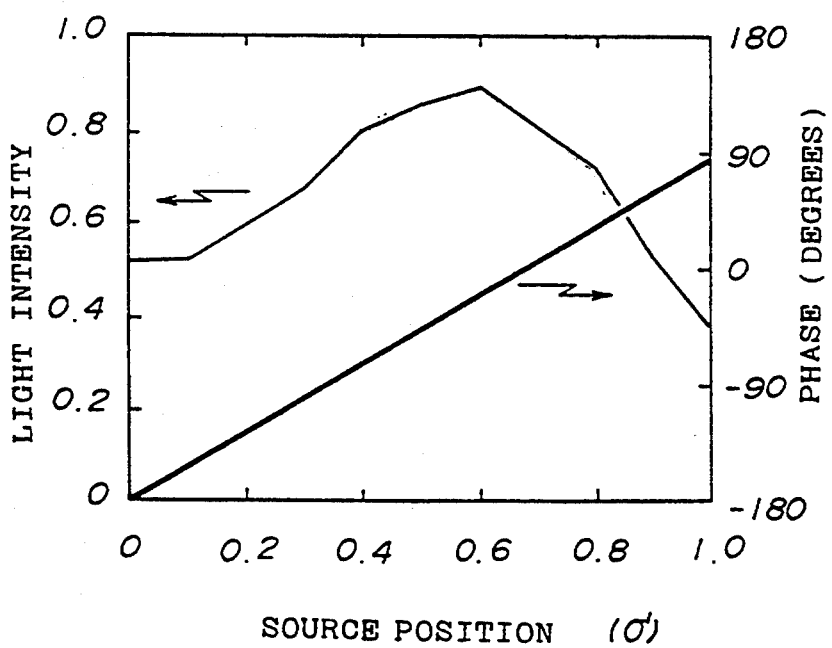
FIG. 10 is a diagram for explaining the source position and the phase difference of the diffracted light caused by a first subspace and the light which interferes therewith.
Figure 11:
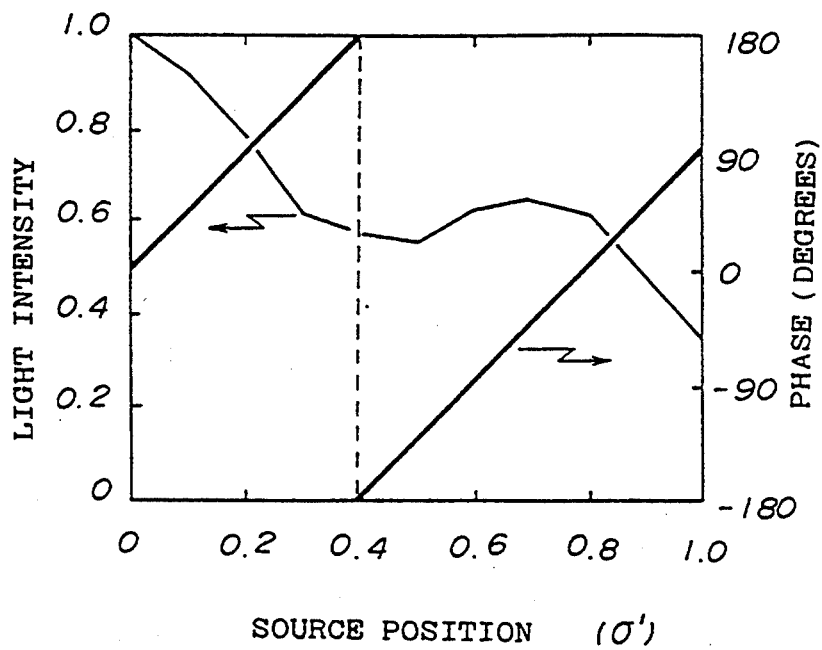
FIG. 11 is a diagram for explaining the source position and the phase difference of the diffracted light caused by a second subspace and the light which interferes therewith.

When the phase difference is calculated at the center position of the main space 106 for the diffracted light $A_{1st}$ due to the first subspace 110 and the light which interferes therewith, the phase difference becomes 0° at a source position $\sigma'$ of approximately 0.68 as shown in FIG. 10, where the source position $\sigma'$ is defined by $\sigma' = m \times \sin\delta/NA$. Similarly, when the phase difference is calculated at the center position of the main space 106 for the diffracted light $A_{2nd}$ due to the second subspace 111 and the light which interferes therewith, the phase difference becomes 0° at a source position $\sigma'$ of approximately 0.77 as shown in FIG. 11.

In order to increase the intensity of the light transmitted through the main space 106, it may be seen that measures must be taken so that the phase difference of the interfering lights is 0° at the main space 106, that is, the incident angle of the light from the light source irradiating the optical mask 104 satisfies a condition such that the source position $\sigma'$ is 0.6 to 0.8. However, if the source position $\sigma'$ exceeds 0.7, the light intensity originating from the main space 106 decreases. For this reason, it is desirable that the source position $\sigma'$ is 0.6 to 0.7 so that the effect of increasing the light intensity is large.

Figure 12:
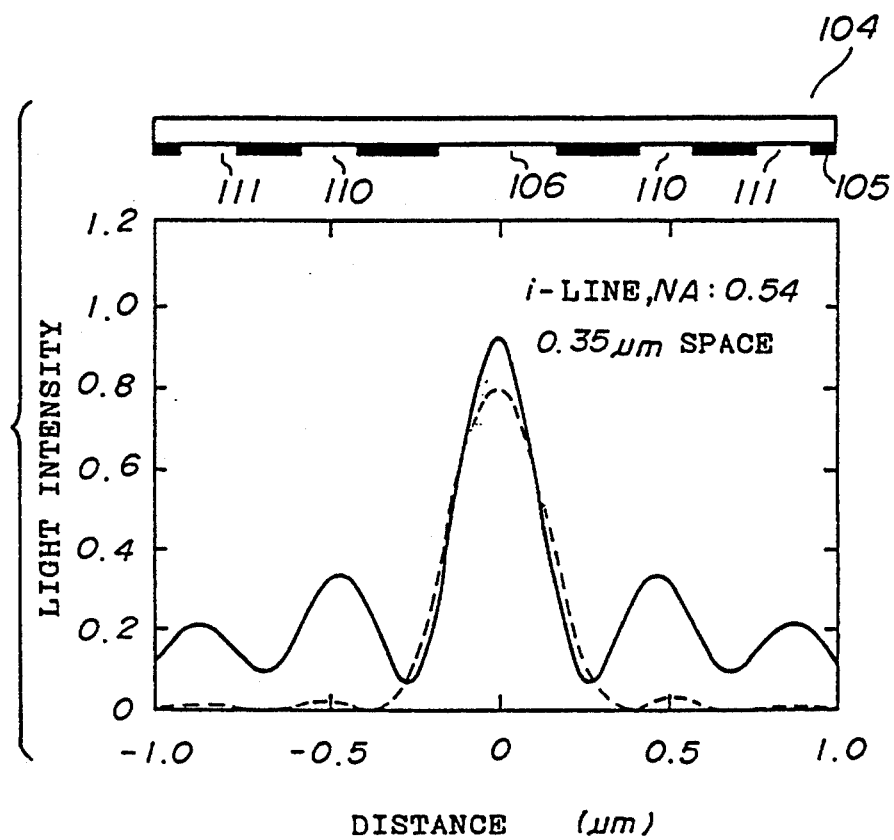
FIG. 12 is a diagram showing a simulation result of the light intensity distribution in a sixth embodiment of the projection exposure method according to the present invention.

FIG. 12 shows the simulation result of the light intensity distribution which is obtained in this embodiment. In FIG. 12, the solid line indicates the light intensity distribution obtained in this embodiment. In this case, the wavelength of the exposing light is 365 nm, the numerical aperture NA of the lens 3 is 0.54, and the incident angle of the light from the light source 9 irradiating the optical mask 104 is set so that $0.6 < \sigma' < 0.7$. In addition, the width of the main space 106 is 0.35 $\mu$m, the width of the first and second subspaces respectively are 0.15 $\mu$m, the distance between the center positions of the main space 106 and the first subspace 110 is 0.5 $\mu$m, and the distance between the center positions of the main space 106 and the second subspace 111 is 0.875 μm.

In FIG. 12, the dotted line indicates the simulation result of the light intensity distribution which is obtained in the case of an optical mask having only the main space 106 which has the width of 0.35 μm, under the same conditions described above. As may be seen from FIG. 12, the peak light intensity is improved by approximately 18% compared to the optical mask having only the main space 106, and it is possible to obtain a sharper main-lobe.

According to this embodiment, it is possible to improve the light intensity distribution particularly when exposing an isolated pattern. In addition, it is also effective in suppressing the deterioration of the light intensity introduced at ends of a periodic line-and-space pattern when exposing such a line-and-space pattern.

Figure 13A:
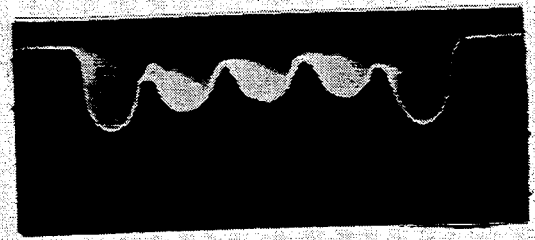
FIGS. 13A through 13C respectively are photographs showing exposure patterns which are obtained when a line-and-space pattern is exposed using light sources having various shapes.
Figure 13B:
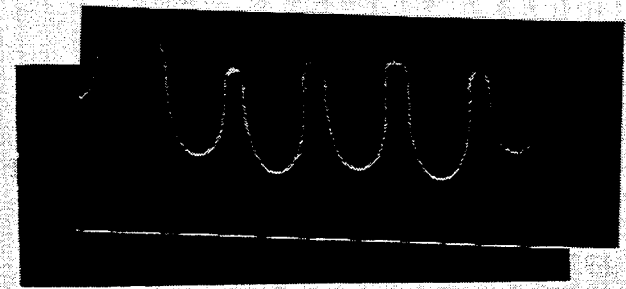
Figure 13C:
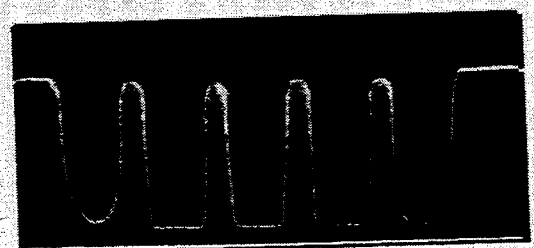

FIGS. 13A through 13C show photographs of the exposed patterns when a line-and-space pattern having a width of 0.25 μm is exposed using light sources having various shapes. In this case, the wavelength λ of the exposing light is the i-line, the numerical aperture NA of the lens 3 is 0.54. If a normal light source is used, the exposed pattern becomes as shown in FIG. 13A, and an accurate line-and-space pattern cannot be obtained.

But when the ring shaped light source such as that shown in FIG. 6A is used, it is possible to obtain a line-and-space pattern shown in FIG. 13B which is greatly improved compared to that shown in FIG. 13A. In addition, if the light source shown in FIG. 6B is used, it is possible to obtain a line-and-space pattern shown in FIG. 13C which is further improved when compared to that shown in FIG. 13B. In FIG. 13C, the shape of the pattern at both ends are not as accurate compared to that at the central part, but the shape of the pattern at both ends can be made approximately the same as that at the central part by using an optical mask having the first and second subspaces as in the case of the third embodiment of the projection optical mask described above.

Further, the present invention is not limited to these embodiments, but various variations and modifications may be made without departing from the scope of the present invention.

What is claimed is:

1. A projection exposure method comprising the steps of:
  (a) irradiating a light from a light source on an optical mask, said optical mask including a main space which transmits light and has a desired exposure pattern, and a subspace which transmits light and is provided adjacent to the main space,
    wherein said step (a) irradiates the optical mask by the light from the light source with a predetermined oblique angle to a projection optical axis which is perpendicular to the optical mask; and
  (b) exposing a photoresist layer by the light which is transmitted through the optical mask and a lens so as to project an optical image of the main space, said subspace having a narrow width such that the light transmitted through the subspace by itself does not expose the photosensitive layer.

2. The projection exposure method as claimed in claim 1, wherein said step (a) uses the light source selected from a group consisting of a light source which has a ring shape about the projection optical axis, and a light source which is arranged only on both sides of the projection optical axis.

3. The projection exposure method as claimed in claim 1, wherein said step (a) uses the optical mask in which a distance between center positions of the main space and the subspace is given by $(\lambda/NA) \times m \times L$, where $\lambda$ denotes the wavelength of the light emitted from the light source, NA denotes the numerical aperture of the lens, 1/m denotes the reduced projection magnification, and L is 0.7 to 0.8.

4. The projection exposure method as claimed in claim 1, wherein said step (a) uses the optical mask in which the subspace is made up of at least a first subspace and a second subspace.

5. The projection exposure method as claimed in claim 4, wherein said step (a) uses the optical mask in which a distance $d_1$ between center positions of the main space and the first subspace is given by $d_1 = D_1 \times m \times (\lambda/NA)$, a distance $d_2$ between center positions of the main space and the second subspace is given by $d_2 = D_2 \times m \times (\lambda/NA)$, a width s of the main space is given by $s = W \times m \times (\lambda/NA)$, a width $s_1$ of the first subspace is given by $s_1 = W_1 \times m \times (\lambda/NA)$, and a width $s_2$ of the second subspace is given by $s_2 = W_2 \times m \times (\lambda/NA)$, where $\lambda$ denotes the wavelength of the light emitted from the light source, NA denotes the numerical aperture of the lens, 1/m denotes the reduced projection magnification, $D_1$ is 0.7 to 0.8, $D_2$ is 1.2 to 1.3, W is 0.3 to 0.4, $W_1$ is 0.2 to 0.3, and $W_2$ is 0.2 to 0.3.

6. The projection exposure method as claimed in claim 5, wherein said step (a) uses the light source which irradiates the optical mask with a predetermined angle δ to a projection optical axis which is perpendicular to the optical mask, and σ' is 0.6 to 0.7 when $\sigma' = \sin\delta/(NA/m)$.

7. A projection optical mask for an exposure system in which a light from a light source irradiates the projection optical mask adapted to receive the light from the light source at a predetermined oblique angle to a projection optical axis and in which an optical image transmitted through the projection optical mask is projected on a photoresist layer via a lens, said projection optical mask comprising:
  a main space which transmits light and has a desired exposure pattern; and
  at least one subspace which transmits light and is provided adjacent to the main space, said subspace having a narrow width such that the light transmitted through the subspace by itself does not expose the photosensitive layer.

8. The projection optical mask as claimed in claim 7, wherein a distance between center positions of the main space and the subspace is given by $(\lambda/NA) \times m \times L$, where $\lambda$ denotes the wavelength of the light emitted from the light source, NA denotes the numerical aperture of the lens, 1/m denotes the reduced projection magnification, and L is 0.7 to 0.8.

9. The projection optical mask as claimed in claim 7, wherein said projection optical mask comprises at least a first subspace and a second subspace.

10. The projection optical mask as claimed in claim 9, wherein a distance $d_1$ between center positions of the main space and the first subspace is given by $d_1 = D_1 \times m \times (\lambda/NA)$, a distance $d_2$ between center positions of the main space and the second subspace is given by $d_2 = D_2 \times m \times (\lambda/NA)$, a width s of the main space is given by $s = W \times m \times (\lambda/NA)$, a width $s_1$ of the first subspace is given by $s_1 = W_1 \times m \times (\lambda/NA)$, and a width $s_2$ of the second subspace is given by $s_2 = W_2 \times m \times (\lambda/NA)$, where $\lambda$ denotes the wavelength of the light emitted from the light source, NA denotes the numerical aperture of the lens, $1/m$ denotes the reduced projection magnification, $D_1$ is 0.7 to 0.8, $D_2$ is 1.2 to 1.3, W is 0.3 to 0.4, $W_1$ is 0.2 to 0.3, and $W_2$ is 0.2 to 0.3.

11. The projection optical mask as claimed in claim 7, wherein said subspace is provided on both sides of said main space.

12. The projection optical mask as claimed in claim 7, wherein said subspace is provided on only one side of said main space.

13. The projection optical mask as claimed in claim 7, wherein said main space is a part of a line-and-space pattern and is provided at an end of the line-and-space pattern, and said subspace is provided on one side of the main space opposite to the side provided with the line-and-space pattern.

14. A projection exposure method comprising the steps of:
 (a) irradiating a light from a light source on an optical mask, said optical mask including a main space which transmits light and has a desired exposure pattern, and a subspace which transmits light and is provided adjacent to the main space,
 wherein said step (a) irradiates the optical mask by the light from the light source with a predetermined oblique angle to a projection optical axis which is perpendicular to the optical mask; and
 (b) exposing a photoresist layer by the light which is transmitted through the optical mask and a lens so as to project an optical image of the main space, said subspace having a narrow width such that the light transmitted through the subspace by itself does not expose the photosensitive layer, and said subspace being arranged adjacent to the main space so that the light transmitted through the subspace increases the peak intensity of the light transmitted through the main space on the photoresist.

15. A projection optical mask for an exposure system in which a light from a light source irradiates the projection optical mask adapted to receive the light from the light source at a predetermined oblique angle to a projection optical axis and in which an optical image transmitted through the projection optical mask is projected on a photoresist layer via a lens, said projection optical mask comprising:
 a main space which transmits light and has a desired exposure pattern; and
 at least one subspace which transmits light and is provided adjacent to the main space, said subspace having a narrow width such that the light transmitted through the subspace by itself does not expose the photosensitive layer, and said subspace being arranged adjacent to the main space so that the light transmitted through the subspace increases the peak intensity of the light transmitted through the main space on the photoresist.

* * * * *